(12) United States Patent
Suzuki et al.

(10) Patent No.: US 8,129,287 B2
(45) Date of Patent: Mar. 6, 2012

(54) METHOD FOR MANUFACTURING SEMICONDUCTOR DEVICE AND SEMICONDUCTOR DEVICE

(75) Inventors: Tatsuya Suzuki, Kanagawa (JP); Hidemitsu Aoki, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 406 days.

(21) Appl. No.: 12/139,774

(22) Filed: Jun. 16, 2008

(65) Prior Publication Data

US 2008/0248651 A1 Oct. 9, 2008

Related U.S. Application Data

(62) Division of application No. 11/447,962, filed on Jun. 7, 2006, now Pat. No. 7,402,530, which is a division of application No. 10/685,571, filed on Oct. 16, 2003, now Pat. No. 7,087,494.

(30) Foreign Application Priority Data

Oct. 17, 2002 (JP) .................................. 2002-303631

(51) Int. Cl.
*H01L 21/302* (2006.01)
*H01L 21/461* (2006.01)

(52) U.S. Cl. ................ 438/745; 438/756; 257/E21.254; 257/E21.255; 257/E21.483; 257/E21.485; 257/E21.625

(58) Field of Classification Search .................. 438/756, 438/746, 745; 257/E21.254, E21.255, E21.625, 257/E21.483, E21.485
See application file for complete search history.

(56) References Cited

U.S. PATENT DOCUMENTS

| | | | | |
|---|---|---|---|---|
| 5,635,022 A | * | 6/1997 | Vaartstra | 438/723 |
| 6,086,773 A | * | 7/2000 | Dufresne et al. | 216/8 |
| 6,225,167 B1 | * | 5/2001 | Yu et al. | 438/275 |
| 6,300,202 B1 | | 10/2001 | Hobbs et al. | |
| 6,346,445 B1 | * | 2/2002 | Hsu | 438/279 |
| 6,451,641 B1 | * | 9/2002 | Halliyal et al. | 438/200 |
| 6,828,184 B2 | * | 12/2004 | Cho | 438/201 |
| 6,835,667 B2 | * | 12/2004 | Christenson et al. | 438/745 |
| 6,855,639 B1 | | 2/2005 | Brask et al. | |

FOREIGN PATENT DOCUMENTS

| | | |
|---|---|---|
| JP | 3-49244 | 3/1991 |
| JP | 3-185852 | 8/1991 |
| JP | 2000-003965 | 1/2000 |
| JP | 2000-243856 | 9/2000 |
| JP | 2001-44429 | 2/2001 |
| JP | 2001-274378 | 10/2001 |
| JP | 2002-075950 | 3/2002 |
| JP | 2002-164316 | 6/2002 |
| JP | 2002-192090 | 7/2002 |

OTHER PUBLICATIONS

Eom, Dae-Hong et al.; Oct. 2002; Japanese Journal of Applied Physics; vol. 41, No. 10; pp. 5881-5886).*

* cited by examiner

*Primary Examiner* — Stephen W Smoot
*Assistant Examiner* — Vicki B Booker
(74) *Attorney, Agent, or Firm* — Young & Thompson

(57) ABSTRACT

A first oxide film and a second oxide film 16 are formed in a first region 13a and a second region 13b, respectively, on the surface of the semiconductor substrate 10, via thermal oxidization method, and the first oxide film is removed while the second oxide film 16 is covered with the resist layer 18 formed thereon, and then the resist layer 18 is removed with a chemical solution containing an organic solvent such as isopropyl alcohol as a main component. Subsequently, a third oxide film 22 having different thickness than the second oxide film 16 is formed in the first region 13a.

16 Claims, 10 Drawing Sheets

(1) AFTER REMOVING RESIST LAYER
(2) AFTER APM/DHF CLEANING
(3) AFTER THERMAL OXIDIZATION

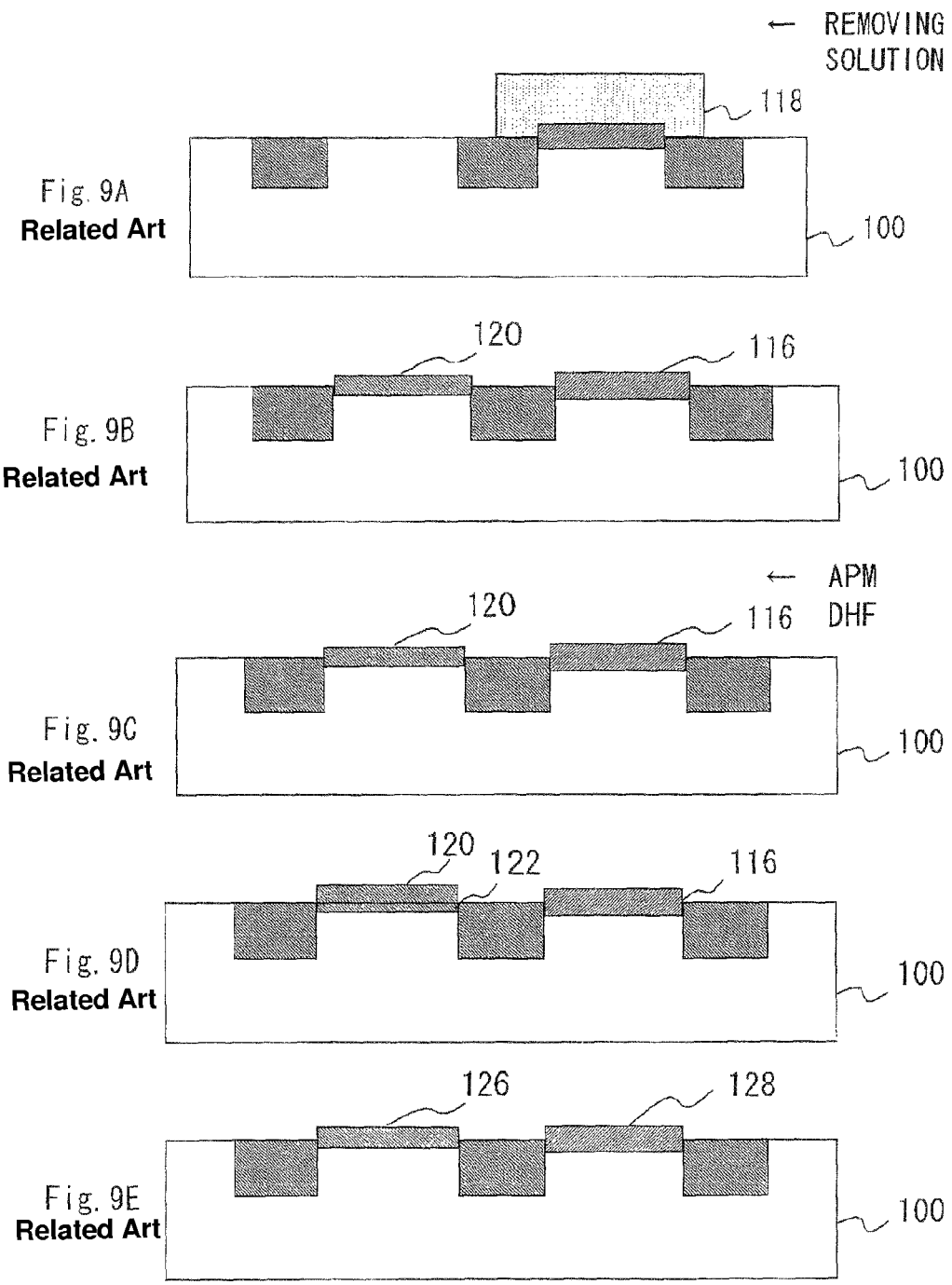

Fig. 10

| HfO$_2$ | | | | SELECTIVITY RATIO |
|---|---|---|---|---|
| CHEMICAL SOLUTION | TEMP. | HfO$_2$ | SiO$_2$ | HfO$_2$/SiO$_2$ |
| PHOSPHORIC ACID (85%) | 160°C | 0.2nm/min | 2nm/min | 0.1 |
| SULFURIC ACID (96%) | 160°C | 0.1nm/min | 0.01nm/min | 10 |
| HYDROFLUORIC ACID (50%) | AMBIENT TEMP. | 0.1nm/min | 1.7mm/min | <0.0001 |

Fig. 11

| HfAlOx | | | | SELECTIVITY RATIO |
|---|---|---|---|---|
| CHEMICAL SOLUTION | TEMP. | HfAlO$_x$ | SiO$_2$ | HfAlO$_x$/SiO$_2$ |
| PHOSPHORIC ACID (85%) | 80°C | >1nm/min | <0.1nm/min | >10 |
| SULFURIC ACID (96%) | 160°C | >1nm/min | 0.01nm/min | >10 |
| DHF (0.5%) | AMBIENT TEMP. | >5nm/min | 4nm/min | >1 |

METHOD FOR MANUFACTURING SEMICONDUCTOR DEVICE AND SEMICONDUCTOR DEVICE

The present application is a Divisional of U.S. application Ser. No. 11/447,962, filed on Jun. 7, 2006, now U.S. Pat. No. 7,402,530, which is a Divisional of U.S. application Ser. No. 10/685,571, filed on Oct. 16, 2003, now U.S. Pat. No. 7,087,494, which are all hereby incorporated by reference.

This application is based on Japanese patent application NO. 2002-303631, the content of which is incorporated hereinto by reference.

BACKGROUND OF THE INVENTION

1. Field of the Invention

The present invention relates to a method for manufacturing a semiconductor device and a semiconductor device. More specifically, the present invention relates to a method for manufacturing a semiconductor device in which a film is deposited on a semiconductor substrate, and a method for manufacturing a semiconductor device comprising exposing at least a part of the semiconductor substrate during a process for manufacturing the semiconductor device.

2. Description of the Related Art

In recent years, for the purpose of satisfying the increased needs for obtaining higher level of the integration for semiconductor devices, a type of semiconductor device which comprises various types of devices including gate insulating films having different thickness (simply referred as "multi-oxide" hereinafter) is developed. A general method for manufacturing a conventional semiconductor device having multi-oxides will be described in reference to FIGS. 8A to 8D and 9A to 9E.

As shown in FIG. 8A, a device isolation region 112 is formed on a silicon substrate 110, and thereafter an oxide film 114 and an oxide film 116 are formed thereon via a thermal oxidization. Consecutively, a resist layer 118 is formed on the oxide film 116, as shown in FIG. 8B.

The resultant substrate having films thereon is then wet-etched by using an etch solution such as buffered hydrofluoric acid (BHF), as shown in FIG. 8C. The operation provides that the oxide film 114 is removed, as shown in FIG. 8D. Then, the resultant substrate having films thereon is processed with a removing agent, as shown in FIG. 9A, and the resist layer 118 is removed, as shown in FIG. 9B. Then, as shown in FIG. 9C, the silicon substrate surface is cleaned with ammonia-hydrogen peroxide mixture (APM) to remove the particulate contaminants, and after that the residual metals and so on are removed by using diluted hydrofluoric acid (DHF).

Subsequently, an oxide film 122 is formed via a thermal oxidization, as shown in FIG. 9D. This processing provides that two gate insulating films 126 and 128 having different thickness are formed as shown in FIG. 9E.

The related conventional technology is disclosed in JP-A-2000-3,965 (pp. 3, FIGS. 57 to 62) and "Ultra Clean ULSI Technology" of OHMI, Tadahiro (written in Japanese), 1995, BAIFUKAN, Tokyo Japan (pp. 156 to 157).

In general, the removing solution or remover for removing organic compounds such as resist layer 118 contains sulfuric acid hydrogen peroxide solution mixture (SPM) including sulfuric acid as a main component, that is heated at a temperature of not lower than 100 degree. C. (see, for example, JP-A-2000-3,965). However, when the SPM containing sulfuric acid and hydrogen peroxide for removing the resist layer 118, an unwanted chemical oxide film 120 is formed on the surface of the silicon substrate 100 as shown in FIG. 9B, causing difficulty in controlling the thickness of the formed gate insulating film to be thinner. Also, when moisture remains on the surface of the silicon substrate 100, stains such as watermark or the like is formed, causing difficulty in controlling the uniformity of the quality of the formed film.

Meanwhile, the recent technical progress in the miniaturization of the semiconductor devices requires improving the switching rate of transistors by designing the transistor to have a shorter gate length. In order to provide shorter gate length for the transistor, the thickness of the gate insulating film should be formed to have thinner film thickness, and therefore a technology for controlling the film thickness of the formed film to be thinner is required.

Further, while the technology for providing the film thickness of the formed film to be thinner is required, the device design of having shorter gate length of the transistor causes a problem, in which the gate leakage electrical current increases to a considerable level. Thus, it is expected to solve the problem by employing a conventionally used insulating film having higher dielectric constant than silicon oxide ($SiO_2$) film (hereinafter referred as "high-k film") to provide physically thicker film while maintaining the dielectric properties thereof.

However, the high-k film generally involves a problem of having lower thermal resistance, and thus when a high-k film is formed directly on the silicon substrate, a chemical reaction between the high-k film and the surface of the silicon substrate during thermal processing causes the device properties to deteriorate. Therefore, it is proposed to provide a silicon oxide film between the high-k film and the silicon substrate to inhibit such deterioration of the device properties (see, for example, JP-A-2001-274,378). In this case, the thickness of the formed silicon oxide film is preferably controlled to have as thin a film thickness as possible, in order to maintain the driving capacity of the gate.

SUMMARY OF THE INVENTION

In view of the above situation, the present invention provides a solution to the above-mentioned problems, and it is an object of the present invention to provide a technology of controlling the thickness of the silicon oxide film formed on the semiconductor substrate to be thinner. It is another object of the present invention to prevent the formation of the unwanted film or the stain such as watermark on the semiconductor substrate. It is yet another object of the invention to provide a technology of controlling the uniformity of the film formed on the semiconductor substrate.

According to one aspect of the present invention, there is provided a method for manufacturing a semiconductor device, comprising: forming a patterned film having a predetermined geometry on a semiconductor substrate; and wet-processing the surface of the semiconductor substrate that has an exposed surface of a semiconductor material with a chemical solution containing an organic solvent as a main component, after the step of forming the patterned film.

The semiconductor substrate according to the present invention may comprise: an element semiconductor such as Si, Ge, or the like; a compound semiconductor such as GaAs, GaN, InP, CdS, SiC, or the like; or a mixed crystal semiconductor such as InGaAs, HgCdTe or the like. The term "surface of the semiconductor substrate" indicates a working surface of the semiconductor substrate. The term "main component" means the component having the largest volume content in the chemical solution here, the chemical solution may mainly contain a nonaqueous solvent. The chemical solution may contain water, and may preferably be free of hydrofluoric acid-containing component, sulfuric acid-containing component or hydrogen peroxide aqueous solution. The wet-processing may be carried out at an ambient temperature. Here, the term "wet-processing" indicates a processing of, for example, rinse processing, cleaning or wet etching for the semiconductor substrate.

The configuration described above provides preventing the adhesion of water on an exposed surface of the semiconductor substrate when the exposed surface appears, and therefore the formation of unwanted films or watermarks on the semiconductor substrate surface can be prevented.

According to another aspect of the present invention, there is provided a method for manufacturing a semiconductor device, comprising: forming a film on a semiconductor substrate; removing at least a part of the film with a chemical solution containing an organic solvent as a main component; and exposing at least a part of the surface of the semiconductor substrate.

This configuration provides a prevention of forming an unwanted film such as a chemical oxide film on the semiconductor substrate when the semiconductor surface of the semiconductor substrate is partially exposed by the processing of removing the film on the semiconductor substrate.

According to further aspect of the present invention, there is provided a method for manufacturing a semiconductor device, comprising: forming a film on a semiconductor substrate; partially removing the film to expose a part of the surface of the semiconductor substrate; and conducting a wet processing for the semiconductor substrate with a chemical solution containing an organic solvent as a main component. In this method, the wet processing for the semiconductor substrate with a chemical solution containing an organic solvent as a main component can be conducted after exposing a part of the surface of the semiconductor substrate without conducting a cleaning processing for the semiconductor substrate with pure water.

According to yet other aspect of the present invention, there is provided a method for manufacturing a semiconductor device, comprising: forming a first film and a second film on a semiconductor substrate; removing at least a part of the first film to expose a part of the surface of the semiconductor substrate; and removing the second film with a chemical solution containing an organic solvent as a main component. The second film may be a resist layer, for example. The first film may be a gate insulating film, for example.

In the method according to the present invention, the semiconductor substrate may include a first region and a second region, and the first film and the second film may be formed in the first region and the second region, respectively. In addition, the second region may be protected by the second film formed thereon during the formation process of a device in the first region, and after the formation of the device in the first region, the second film may be removed and other device may be formed in the second region. In such case, since the second film is removed by the organic solvent, the formation of an unwanted film such as a chemical oxide film on the surface of the semiconductor substrate may be prevented, even if the first region on the surface of the semiconductor substrate is exposed during the removal processing for the second film.

In this method according to the present invention, the second film having a predetermined geometry may be formed on the first film, and the first film may be selectively removed to expose at least a part of the surface of the semiconductor substrate, so that the first film has the predetermined geometry. As such, since the second film is removed by the organic solvent, the formation of an unwanted film such as a chemical oxide film on the surface of the semiconductor substrate may be prevented, even if the surface of the semiconductor substrate is exposed during the removal processing for the second film.

According to yet another aspect of the present invention, there is provided a method for manufacturing a semiconductor device, comprising: forming a insulating film on a semiconductor substrate; forming a conductive film on the insulating film; forming a patterned protective film having a predetermined geometry on the conductive film; selectively removing the conductive film utilizing the protective film as a mask; selectively removing the insulating film to partially expose the surface of the semiconductor substrate; and conducting a wet processing for the semiconductor substrate with a chemical solution containing an organic solvent as a main component.

The protective film may be formed of a resist layer. The insulating film may be formed of an oxide film or a nitride film. When the semiconductor substrate is a silicon substrate or a SiC substrate, the insulating film may be silicon oxide film or silicon nitride film.

In the manufacturing method for the semiconductor device according to the present invention, the step of removing the insulating film may include a step of removing the protective film before partially exposing the surface of the semiconductor substrate.

In the manufacturing method for the semiconductor device according to the present invention, the step of removing the insulating film may include steps of: selectively removing a part of the insulating film via a dry etching utilizing the protective film as a mask; removing the protective film; and selectively removing the remained part of the insulating film via a wet etching utilizing the conductive film as a mask, to partially expose the surface of the semiconductor substrate.

In the manufacturing method for the semiconductor device according to the present invention, the step of forming the insulating film may include steps of: forming a first insulating film; forming a second insulating film on the first insulating film, the second insulating film being composed of a material having higher dielectric constant than the silicon oxide film.

In the manufacturing method for the semiconductor device according to the present invention, the step of removing the insulating film may include steps of: selectively removing a part of the second insulating film via a dry etching utilizing the protective film as a mask; removing the protective film; and selectively removing the remained part of the insulating film and the first insulating film via a wet etching utilizing the conductive film as a mask, to partially expose the surface of the semiconductor substrate. The etching solution for wet-etching the remaining part of the insulating film may be alcohol, phosphoric acid or sulfuric acid that additionally contain a fluoride-containing compound.

The manufacturing method for the semiconductor device according to the present invention may additionally include a step of forming a device isolation region on the semiconductor substrate before conducting the step of forming the insulating film, and thus, on the device isolation region, the surface of the material of the semiconductor substrate can be exposed in the step of removing the insulating film.

In the manufacturing method for the semiconductor device according to the present invention, the step of forming the insulating film may additionally include a step of forming a high-k insulating film composed of a material having higher dielectric constant than the silicon oxide film, and the step of removing the insulating film may additionally include steps of: selectively removing a part of the high-k insulating film via a dry etching utilizing the protective film as a mask; removing the protective film; and selectively removing the remained part of the high-k insulating film via a wet etching utilizing the conductive film as a mask to partially expose the surface of the semiconductor substrate, and the wet etching may be carried out by using a removing solution or remover containing an organic solvent as a main component and a fluoride-containing compound, a removing solution containing hot phosphoric acid or a removing solution containing sulfuric acid. This configuration provides that, if the semiconductor substrate includes a device isolation region formed thereon, the high-k insulating film can be selectively removed without etching the device isolation region.

The organic solvent for the removing solution that contains an organic solvent as a main component and a fluoride-containing compound may be a solvent having higher flash point in view of easy and safe handling, and typical solvent may be di- or tri-alkyleneglycol monoalkylether-based solvent. More specifically, the available solvent may be: di-ethyleneglycol monobutyl ether; di-ethyleneglycol monomethyl ether; di-propyleneglycol monomethyl ether; di-propyleneglycol monoethyl ether; tri-ethyleneglycol monomethyl ether; tri-propyleneglycol monomethyl ether; tri-propyleneglycol monomethyl ether or the like. Alternatively, instead of using di- or tri-alkyleneglycol monoalkyl ether-based solvent, N-methylpyrrolidone (NMP), propylene carbonate, dimethyl sulfoxide (DMSO), butyrolactone, dimethyl acetamide, tetra hydro furfuryl alcohol (THFA) or the like may be employed, and one selected from these solvent may be used or the mixture thereof may be used.

According to another aspect of the present invention, there is provided a method for manufacturing a semiconductor device, comprising: forming a insulating film on a semiconductor substrate, the insulating film comprising at least a high-k insulating film that has higher dielectric constant than the silicon oxide film; selectively removing the insulating film via a wet etching with a chemical solution containing an organic solvent as a main component to partially expose the surface of the semiconductor substrate.

This manufacturing method for the semiconductor device according to the present invention may additionally include a step of forming a device isolation region on the semiconductor substrate before conducting the step of forming the insulating film, and thus, on the device isolation region, the surface of the material of the semiconductor substrate may be exposed in the step of removing the insulating film. This configuration provides that the high-k insulating film can be selectively removed without etching the device isolation region.

According to another aspect of the present invention, there is provided a method for manufacturing a semiconductor device, comprising: forming a first film and a second film in a first region and a second region, respectively, on a semiconductor substrate; forming a protecting film that covers the second insulating film; removing the first insulating film to expose the surface of the semiconductor substrate in the first region; removing the protective film with a chemical solution containing an organic solvent as a main component; forming a third insulating film on the first region, the third insulating film having different thickness or different composition from the second insulating film.

In this configuration, the first and the second regions may be designed to be device forming regions. Alternatively, the second region is designed to be a gate forming region for I/O port. In such case, the third insulating film may be formed to have thinner thickness than the second insulating film.

In the manufacturing method for the semiconductor device according to the present invention, the first, the second, and the third insulating films may be formed by oxidizing the semiconductor substrate in the respective corresponding regions.

The manufacturing method for the semiconductor device according to the present invention may additionally include a step of forming a first high-k insulating film and a second high-k insulating film on the third insulating film and the second insulating film, respectively, the first high-k insulating film and the second high-k insulating film being composed of a material having higher dielectric constant than the silicon oxide film.

Here, the first high-k insulating film and the second high-k insulating film may be films containing an element of 3A series element, 3B series element or 4A series element. A high-k film may be selected for the films containing an element of 3A series element, 3B series element or 4A series element. The exemplary materials for such films may be zirconium, hafnium, lanthanoid, aluminum, indium, gallium or the oxides thereof. That is, Zr, Hf, Pr, La, Lu, Eu, Yb, Sm, Ho, Ce, Al, In, Ga or the oxides thereof. More specifically, $ZrO_x$, $HfO_x$, $HfAlO_x$, $Al_2O_3$, $In_2O_3$, $Ga_2O_3$ or the like. In particular, $ZrO_x$, $HfO_x$, and $HfAlO_x$ are preferable in view of the performances of the resulting devices and the applicability to the manufacturing process. Alternatively, materials having higher dielectric constant than the dielectric constant of the silicon oxide film (3.9 to 4.5), such as barium titanate ($BaSrTiO_3$), titanium oxide ($TiO_2$), tantalum oxide ($Ta_2O_5$), silicon nitride ($Si_3N_4$), silicon oxynitride (SiON), alumina ($Al_2O_3$) or the like.

In the manufacturing method for the semiconductor device according to the present invention, the organic solvent may preferably be a solvent having polar group. The polar group is a functional group having electronegativity different from that of carbon, such as hydroxyl group, ether bond group, carbonyl group, carboxylic group or the like. The available solvent having polar group may be: alcohols such as isopropyl alcohol, isobutyl alcohol, ethylene glycol, tert-butyl alcohol or the like; ethers such as glycol ether, propyleneglycol monomethyl ether or the like; ketones such as cyclopentanone, cyclohexanone, methylethyl ketone, 2-heptanone or the like; or esters such as propyleneglycol monomethyl acetate or the like, Among these, the preferable solvent may be one or more selected from the group consisting of isopropyl alcohol, ethylene glycol, 2-heptanone, cyclopentanone, methylethyl ketone, glycol ether, propyleneglycol monomethyl ether, and propyleneglycol monomethyl acetate, and in particular isopropyl alcohol is more preferable. This configuration provides that the formation of unwanted films or stains such as watermarks on the semiconductor substrate surface can be prevented. In addition, the solvent may preferably be a hydrophilic solvent.

In the manufacturing method for the semiconductor device according to the present invention, the organic solvent may be isopropyl alcohol, and the chemical solution may contain not less than 90% vol. of isopropyl alcohol.

In the manufacturing method for the semiconductor device according to the present invention, the protecting film may be an i-line resist film.

In the manufacturing method for the semiconductor device according to the present invention, the protecting layer may be formed of a material that is not dissoluble with buffered hydrofluoric acid.

According to another aspect of the present invention, there is provided a method for manufacturing a semiconductor device, comprising: forming an insulating film on a semiconductor substrate, the insulating film comprising at least a high-k insulating film that has higher dielectric constant than the silicon oxide film; selectively removing the insulating film via a wet etching with a chemical solution containing an oxidizing acid or a salt thereof to partially expose the surface of the semiconductor substrate. The available material for the high-k insulating film may be the material same as used for the above-mentioned first high-k insulating film and the second high-k insulating film.

In the manufacturing method for the semiconductor device according to the present invention, the oxidizing acid or the salt thereof may be one or more compounds selected from the group consisting of phosphoric acid, sulfuric acid, nitric acid, perchloric acid, permanganic acid and salts thereof, and cerium ammonium nitrate.

In the manufacturing method for the semiconductor device according to the present invention, the processing for removing the insulating film can be carried out at a chemical solution temperature of 40 degree. C. to 200 degree. C.

According to another aspect of the present invention, there is provided a method for conducting a wet-processing, comprising: conducting a wet-processing to a semiconductor substrate with a chemical solution containing an organic solvent as a main component when at least a part of a device forming region on the semiconductor substrate is exposed.

According to another aspect of the present invention, there is provided a method for conducting a wet-processing, comprising: conducting a wet-processing to a semiconductor substrate with a chemical solution containing an organic solvent as a main component to expose the semiconductor substrate.

According to another aspect of the present invention, there is provided a semiconductor device comprising: a semiconductor substrate; and a first gate insulating film and a second insulating film formed in different regions, respectively, on the semiconductor substrate, wherein the first gate insulating film comprises a first insulating film and a first high-k film formed thereon, wherein the second gate insulating film comprises a second insulating film and a second high-k film formed thereon, the second insulating film having a different thickness or a different material than that of the first insulating film, wherein the first high-k film and the second high-k film are formed of zirconium, hafnium, lanthanoid, aluminum, indium, gallium or the oxides thereof, and have higher dielectric constant than a silicon oxide film.

In the semiconductor device according to the present invention, the film thickness of the first insulating film may be less than 1 nm.

BRIEF DESCRIPTION OF THE DRAWINGS

FIGS. 9A to 9E are schematic sectional views of the semiconductor substrate, showing an example of the related art processing steps;

FIG. 10 is a table showing the results of the etch rate and the etch rate ratio measured in Example 2; and FIG. 11 is a table showing the results of the etch rate and the etch rate ratio measured in Example 3.

DETAILED DESCRIPTION OF THE PREFERRED EMBODIMENTS

The specific constitutions according to the present invention will be described below in detail by referring to the attached drawings. In each of the drawings, each of the elements of the semiconductor device will be exaggerated, for the purpose of easily understanding of the present invention.

First Embodiment

FIGS. 1A to 1D and FIGS. 2A to 2E show the processing steps for manufacturing a semiconductor device according to the first embodiment of the present invention. In this embodiment, the present invention is applied to the manufacturing of the semiconductor device comprising gate insulating films having different thickness.

Figure 1A:
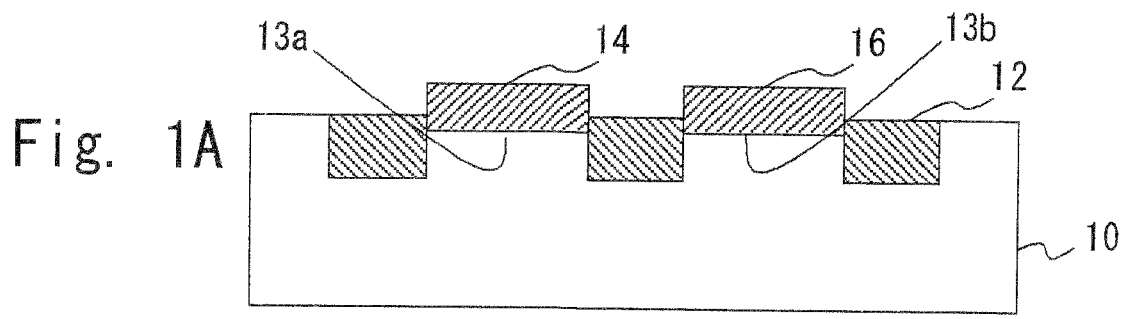
FIGS. 1A to 1D are schematic sectional views of the semiconductor substrate, showing an example of the processing steps described in the first embodiment according to the present invention.
Figure 1B:
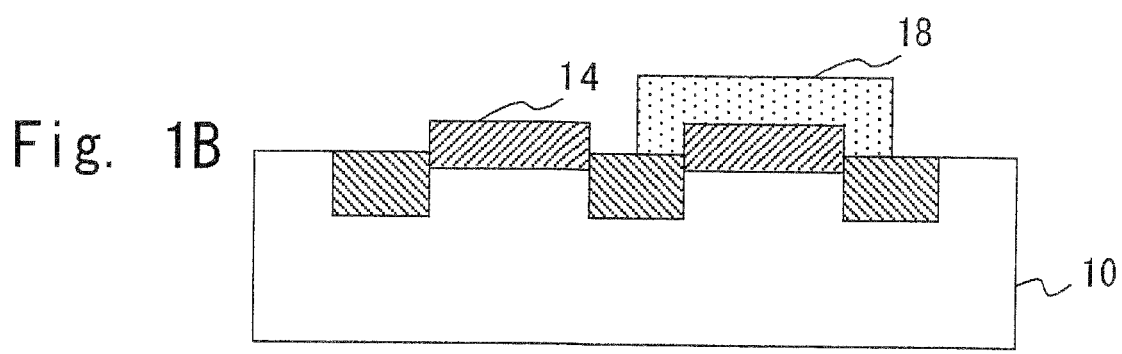
Figure 1C:
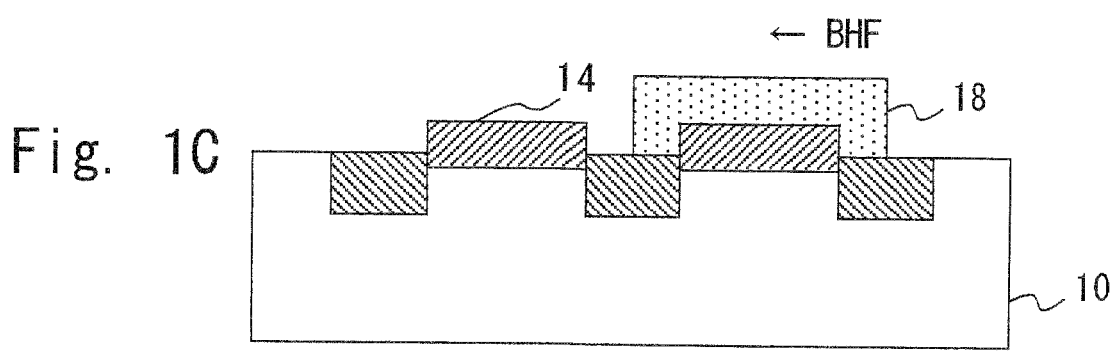
Figure 1D:
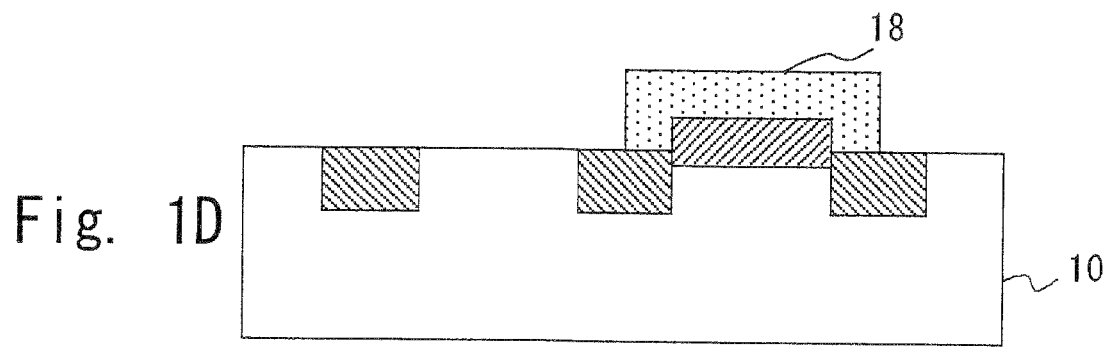

As shown in FIG. 1A, a device isolation region 12 is formed on a silicon substrate 10, and thereafter a first oxide film 14 (having a thickness of, for example, 5.0 nm) and a second oxide film 16 (having a thickness of, for example, 5.0 nm) in a first region 13a and a second region 13b, respectively, via thermal oxidization method. The device isolation region 12 is formed via shallow trench isolation method (STI method), and comprises oxide films formed via CVD or thermal oxidization. Subsequently, a resist layer 18 is formed on the second oxide film 16, as shown in FIG. 1B. The resist layer 18 is an i-line resist layer. The formation of the resist layer 18 is carried out by applying an i-line resist material on the second oxide film 16 to form a resist film and conducting a development by exposing the i-line resist film to i-line emitted from, for example, xenon-mercury lamp (not shown) through a patterning mask (not shown) to form the resist layer 18. The resultant multi-layered structure is then wet-etched with buffered hydrofluoric acid (BHF), as shown in FIG. 1C. As a result, the first oxide film 14 is removed as shown in FIG. 1D.

Figure 2A:
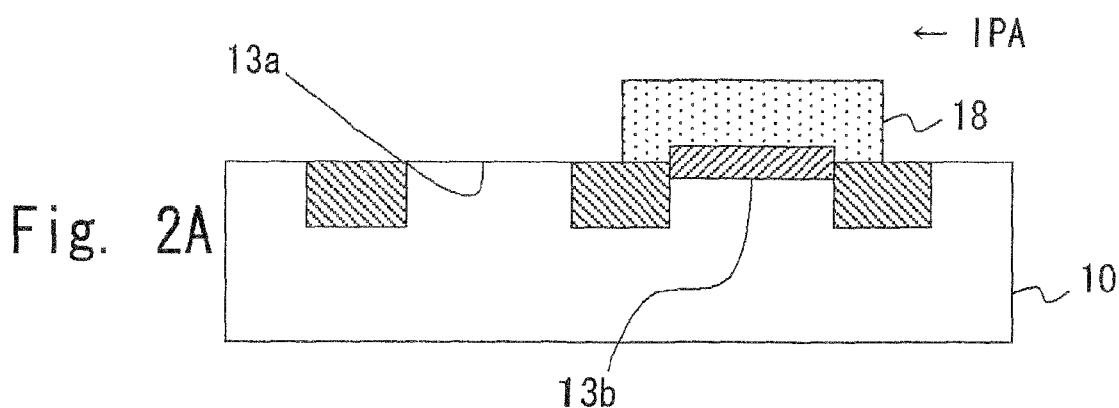
FIGS. 2A to 2E are schematic sectional views of the semiconductor substrate, showing an example of the processing steps described in the first embodiment according to the present invention.
Figure 2B:
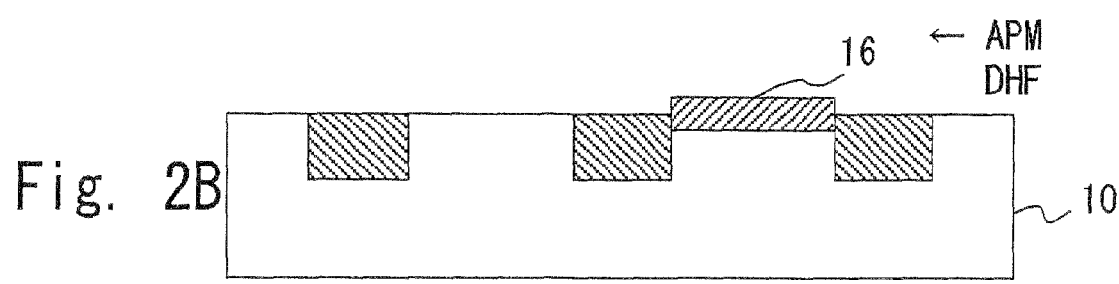
Figure 2C:
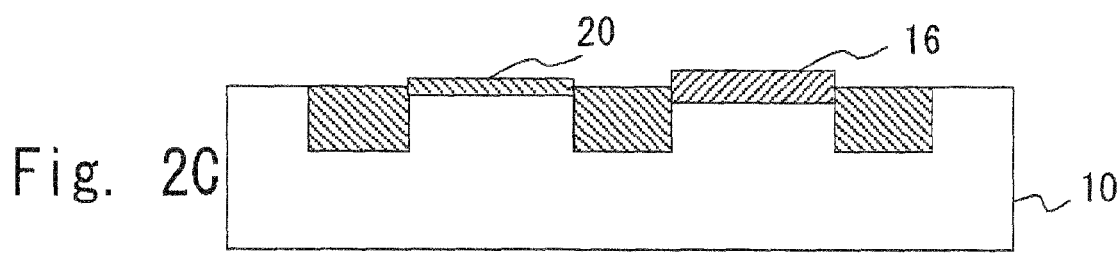

Subsequently, as shown in FIG. 2A, isopropyl alcohol (IPA) is applied thereon at an ambient temperature to remove the resist layer 18 via the wet etching. The wet etching may be carried out via a dipping process or via a single wafer process. In this processing, the resist layer 18 is dissolved into IPA to remove the resist layer 18 as shown in FIG. 2B. Then, particulate contaminants are removed from the surface of the silicon substrate 10 with ammonia-hydrogen peroxide mixture (APM), and thereafter residual metals are cleaned by diluted hydrofluoric acid (DHF) in this occasion, a thin chemical oxide film 20 (having a thickness of, for example, 0.9 nm) is formed on the surface of the silicon substrate (FIG. 2C).

Figure 2D:
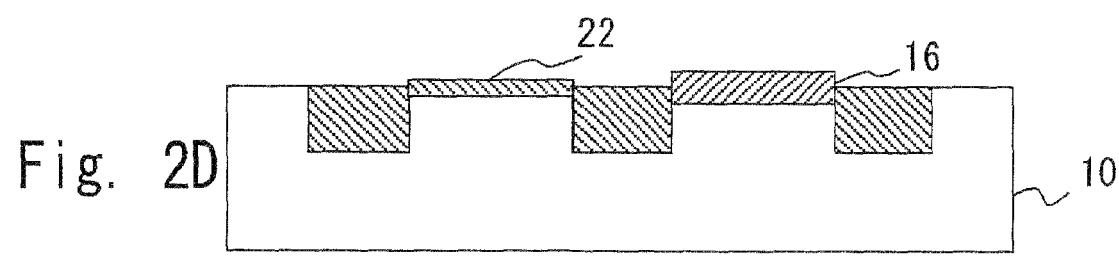
Figure 2E:
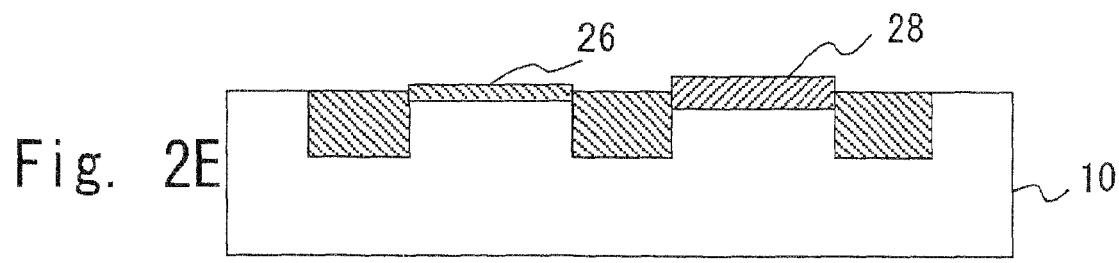

Subsequently, as shown in FIG. 2D, a third oxide film 22 (having a thickness of, for example, 0.8 nm) is formed via rapid thermal oxidation (RTO) process. Through this process, two gate insulating film having different thickness, i.e., the first gate insulating film 26 (having a thickness of, for example, 0.8 nm) and the second gate insulating film 28 (having a thickness of, for example, 5 nm) are formed as shown in FIG. 2E.

In this embodiment, as the resist layer 18 is removed by using IPA, chemical oxide film is not formed on the surface of the silicon substrate 10 during the removing processing for the resist layer 18, and only a thin chemical oxide film 20 is formed during the cleaning process with APM and DHF. As such, in the subsequent process of forming the third oxide film 22 via RTO, the film thickness of the formed film can be controlled to be thinner. Further, as this processing prevent the generation of stains such as watermarks, the uniformity of the quality of the third oxide film 22 can be suitably controlled. In addition, this enables the processing at an ambient-temperature with IPA for removing the resist layer 18, and therefore the gate insulating films having different film thickness can be formed with high process stability by a simple process.

Second Embodiment

FIGS. 3A to 3D and FIGS. 4A to 4C show the processing steps for manufacturing a semiconductor device according to the second embodiment of the present invention. In this embodiment, the present invention is applied to the manufacturing of the semiconductor device by forming a high-k insulating film on gate insulating films having different thickness, i.e., the first gate insulating film 26 and the second gate insulating film 28, as shown in FIG. 2E.

Figure 3A:
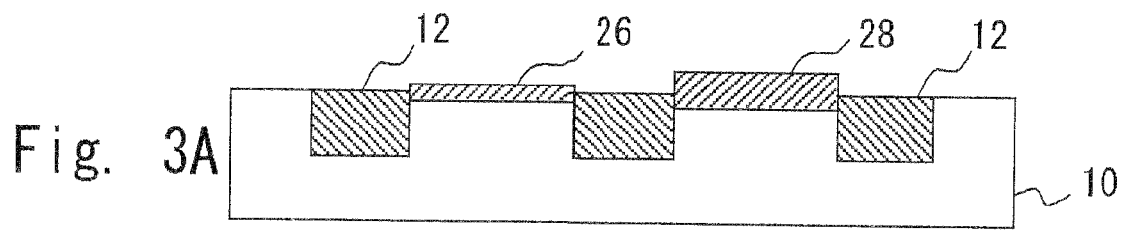
FIGS. 3A to 3D are schematic sectional views of the semiconductor substrate, showing an example of the processing steps described in the second embodiment according to the present invention.
Figure 3B:
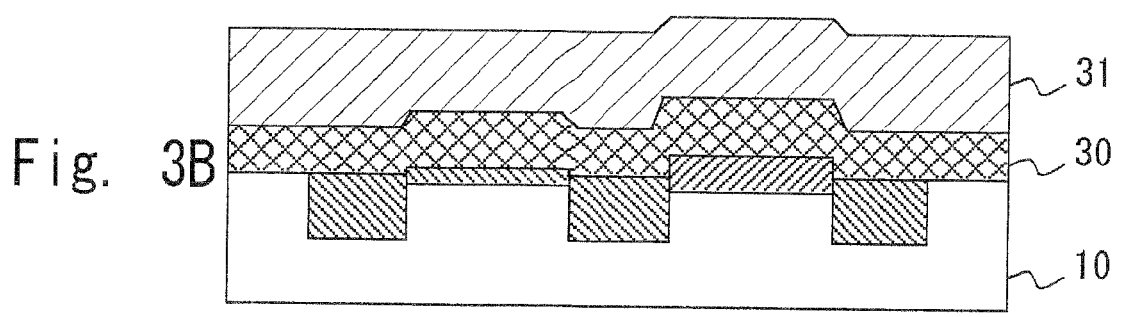

Similarly as described in the first embodiment in reference to FIGS. 1A to 1D and FIGS. 2A to 2E, a first gate insulating film 26 and a second gate insulating film 28 are formed on the silicon substrate 10 having a device isolation region 12 thereon (FIG. 3A). Subsequently, as shown in FIG. 3B, a high-k insulating film 30 (having a thickness of, for example, 3 nm) is deposited via chemical vapor deposition (CDV) such as atomic-layer chemical vapor deposition (ALCVD), metal-organic chemical vapor deposition (MOCVD) and so on, or via sputtering. The high-k insulating film 30 may be formed of a material having larger dielectric constant than that of the silicon oxide film (3.9 to 4.5), for example, hafnium oxide ($HfO_2$), zirconium oxide ($ZrO_2$), $HfAlO_x$ or the like. Further, a polysilicon 31 (having a thickness of, for example, 20 nm) is deposited on the upper surface of the high-k insulating film 30.

Figure 3C:
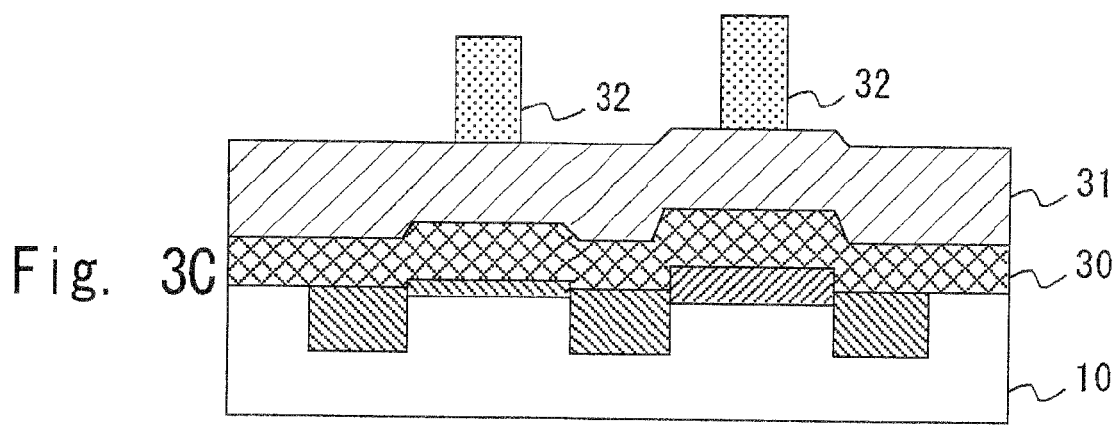
Figure 3D:
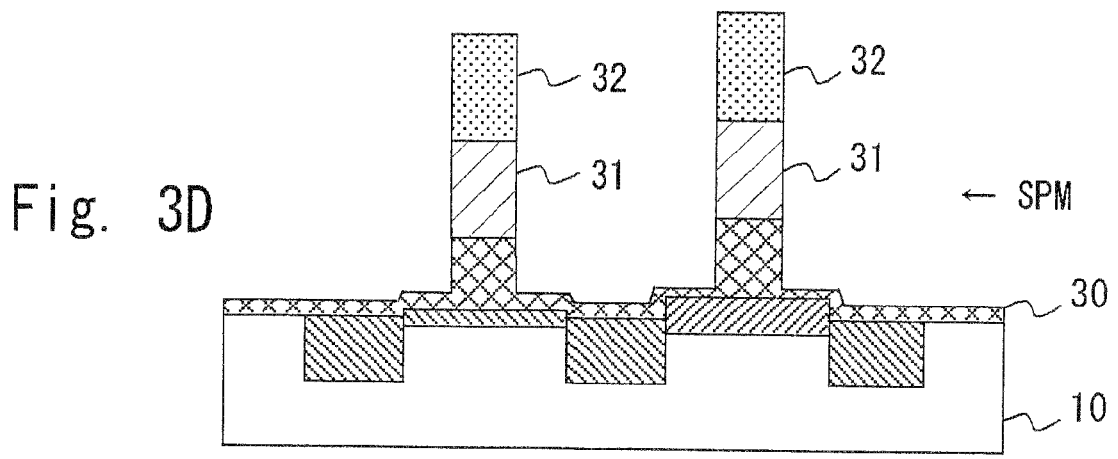

Subsequently, a resist layer 32 is formed on the polysilicon 31, as shown in FIG. 3C. Thereafter, the polysilicon 31 and the high-k insulating film 30 are selectively dry-etched through the mask of the resist layer 32 to carry out a stepwise removal as shown in FIG. 3D. The etching is continued to a halfway to the entire thickness of the high-k insulating film 30, and thereafter the processing with SPM is carried out.

Figure 4A:
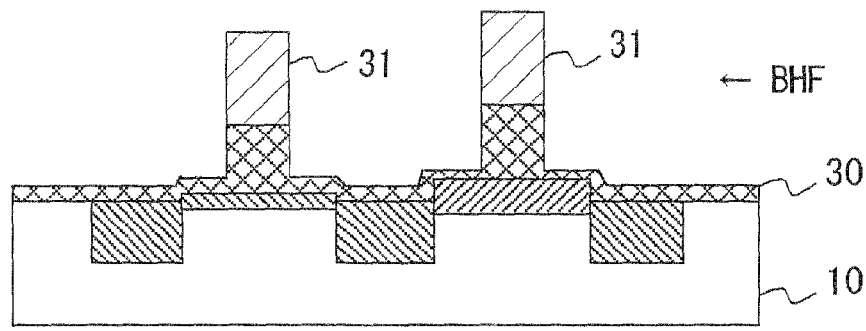
FIGS. 4A to 4C are schematic sectional views of the semiconductor substrate, showing an example of the processing steps described in the second embodiment according to the present invention.
Figure 4B:
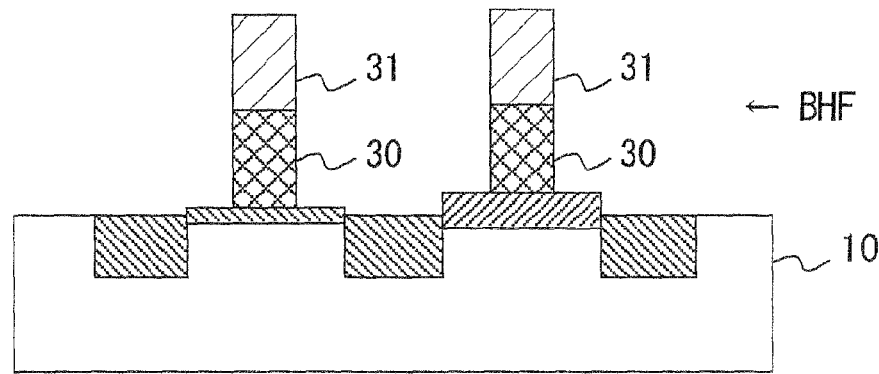
Figure 4C:
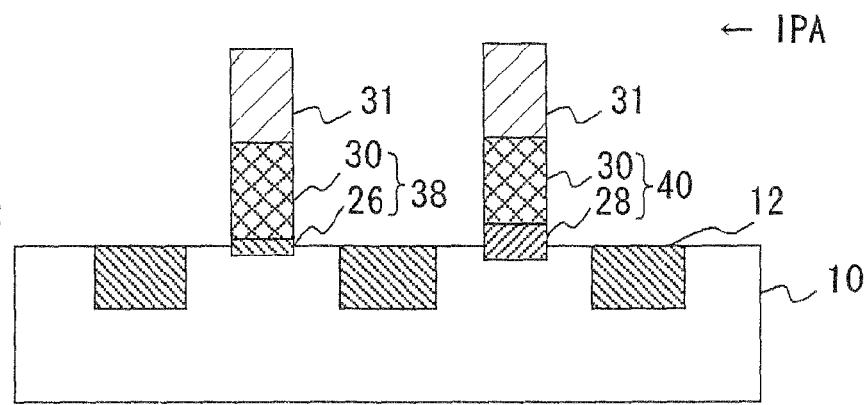

Having this operation, the resist layer 32 is removed, as shown in FIG. 4A. Subsequently, the high-k insulating film 30, the first gate insulating film 26 and the second gate insulating film 28 are selectively removed via the wet-etching through the mask of the polysilicon 31, as shown in FIGS. 4B and 4C. In this processing, BHF may be employed for the etching solution. Also, the available etching solution may be a chemical solution of an organic solvent such as IPA with an additional fluorine compound, phosphoric acid-based aqueous solution or sulfuric acid-based aqueous solution. The phosphoric acid may be hot phosphoric acid. The temperature of the hot phosphoric acid may be 40 degree. C. to 200 degree. C., for example. Also, the sulfuric acid aqueous solution heated to 40 degree. C. to 200 degree. C. may be used. By employing the chemical solution of organic solvent such as IPA with additional fluorine compound, phosphoric acid-based aqueous solution or sulfuric acid-based aqueous solution as the etching solution, the unwanted etching of the device isolation region 12 is prevented. After that, the surface of the silicon substrate 10 is rinsed with IPA. The rinse operation removes moisture remained on the surface of the silicon substrate 10, and therefore the generation of the watermark on the surface of the silicon substrate 10 is prevented.

The third gate insulating film 38 comprising the first gate insulating film 26 and the high-k insulating film 30 formed on the upper surface thereof, and the fourth insulating film 40 comprising the second gate insulating film 28 and the high-k insulating film 30 formed thereon are manufactured by the processes described above.

In this embodiment, the surface of the silicon substrate 10 is cleaned at the time when the silicon substrate 10 is exposed just after the third gate insulating film 38 and the fourth gate insulating film 40 are formed, and therefore moisture remained on the surface of the silicon substrate 10 can be sufficiently removed. Therefore, the generation of the watermark on the surface of the silicon substrate 10 is prevented.

Third Embodiment

This embodiment is related to the method for manufacturing the transistor formed in the device isolation region. The details will be described by referring FIGS. 5A to 5D and FIGS. 6A to 6D.

Figure 5A:
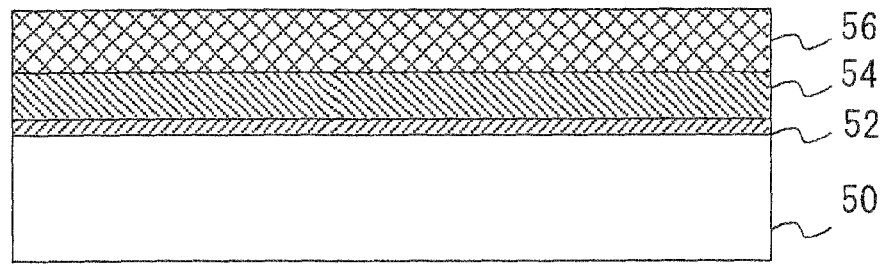
FIGS. 5A to 5D are schematic sectional views of the semiconductor substrate, showing an example of the processing steps described in the third embodiment according to the present invention.

As shown in FIG. 5A, an oxide insulating film 52 (having a thickness of, for example, 0.8 nm) is formed on a silicon substrate 50 via thermal oxidization, and a high-k insulating film 54 (having a thickness of, for example, 2.0 nm) is deposited via CVD or sputtering thereon, and then a polysilicon layer 56 (having a thickness of, for example, 200 nm) is deposited thereon via CVD.

Figure 5B:
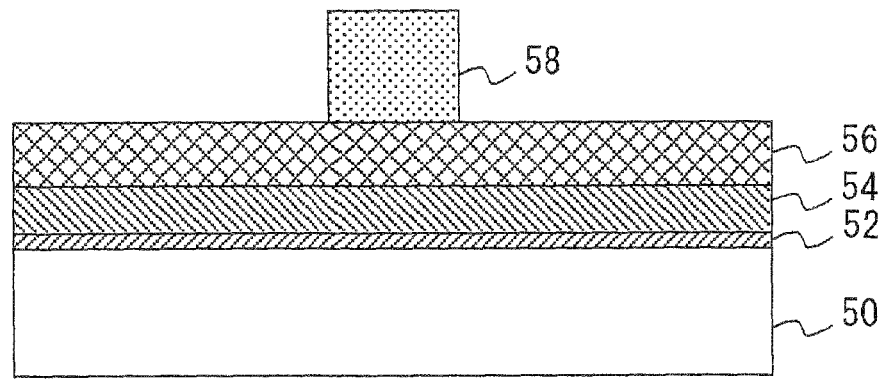
Figure 5C:
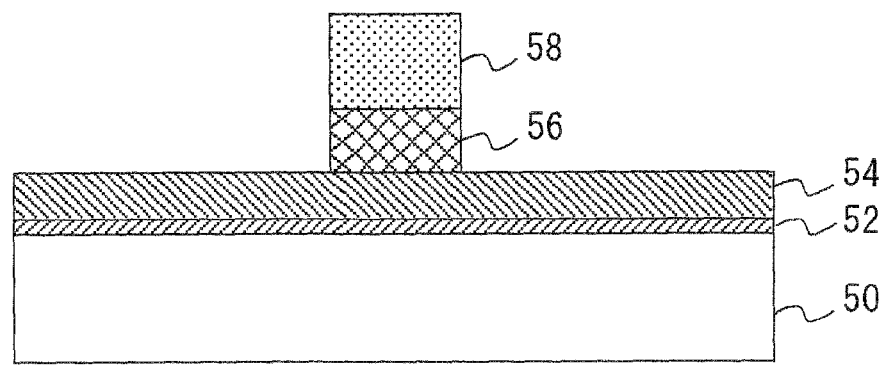
Figure 5D:
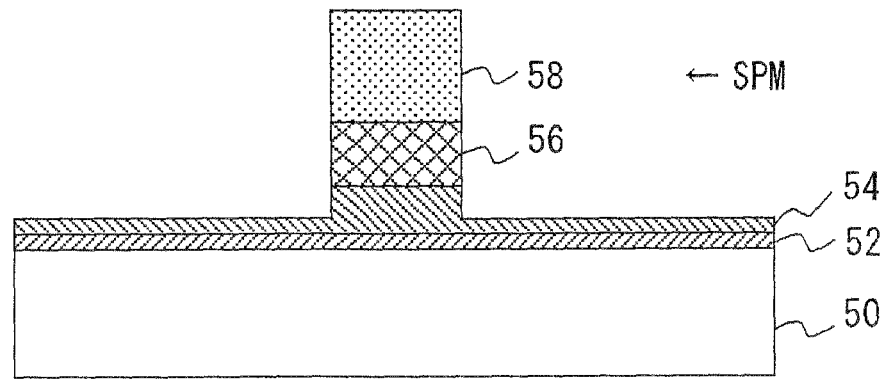
Figure 6A:
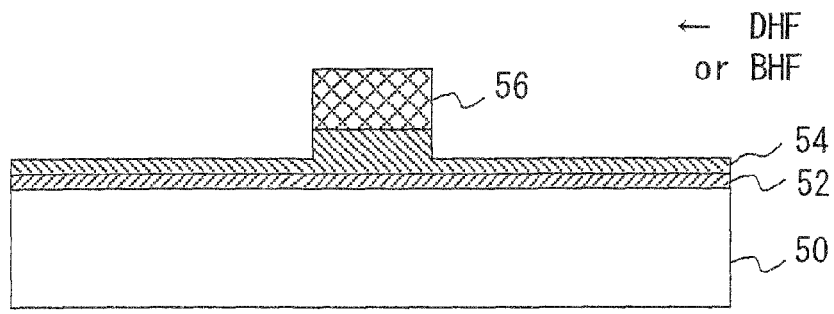
FIGS. 6A to 6D are schematic sectional views of the semiconductor substrate, showing an example of the processing steps described in the third embodiment according to the present invention.

Subsequently, as shown in FIG. 5B, a resist material is deposited on the polysilicon layer 56, and the resist material is processed by a lithography technique using ArF excimer laser to form a resist layer 58. Thereafter, the polysilicon layer 56 and the high-k insulating film 54 are selectively etched through the mask of the resist layer 58 to carry out a stepwise removal, as shown in FIGS. 5C and 5D. The etching is continued to a halfway to the entire thickness of the high-k insulating film 54, and thereafter the processing with SPM is carried out (FIG. 6A).

Figure 6B:
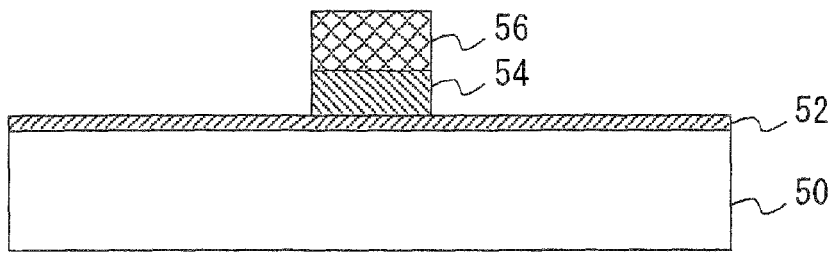
Figure 6C:
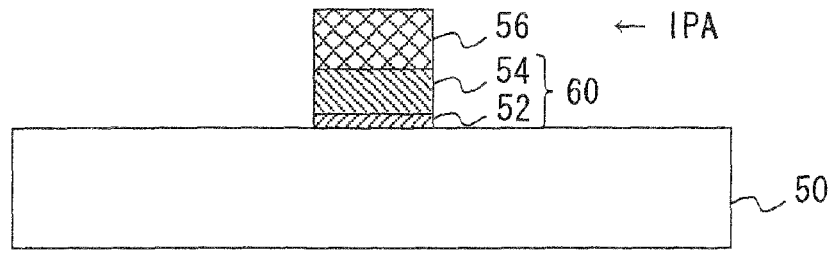

Subsequently, the remaining portion of the high-k insulating film 54 and the oxide insulating film 52 are selectively removed via the wet-etching through the mask of the polysilicon 56 (FIGS. 6B and 6C). In this processing, BHF or DHF may be employed for the etching solution. Also, the available etching solution may be a chemical solution of an organic solvent such as IPA with an additional fluorine compound, or a chemical solution containing an oxidizing acid such as phosphoric acid-based aqueous solution or sulfuric acid-based aqueous solution or salt thereof. The oxidizing acid or salt thereof may preferably contain one or more selected from the group consisting of: phosphoric acid; sulfuric acid; nitric acid; perchloric acid; periodic acid; permanganic acid; and salt thereof; and cerium ammonium nitrate. The phosphoric acid may be hot phosphoric acid. The temperature of the hot phosphoric acid may be 40 degree. C. to 200 degree. C., for example. Also, the sulfuric acid aqueous solution heated to 40 degree. C. to 200 degree. C. may be used. The temperature of the chemical solution such as hot phosphoric acid or sulfuric acid aqueous solution during the removing processing for the high-k insulating film 54 may preferably be set to be not higher than 200 degree. C., and more preferably not higher than 180 degree. C. The lower limit thereof may be set to be, for example, 40 degree. C., and preferably not lower than 60 degree. C. Having these temperature range provides the stable removing processing for the high-k insulating film 54 while inhibiting the surface crazing of the underlying silicon. This configuration may provide a manufacturing of the gate insulating film 60 comprising the oxide insulating film 52 and the high-k insulating film 54.

Thereafter, the surface of the silicon substrate 50 is rinsed with IPA. The rinse processing effectively removes the moisture remained on the surface of the silicon substrate 50, and therefore the generation of the watermark on the surface of the silicon substrate 50 is prevented.

Figure 6D:
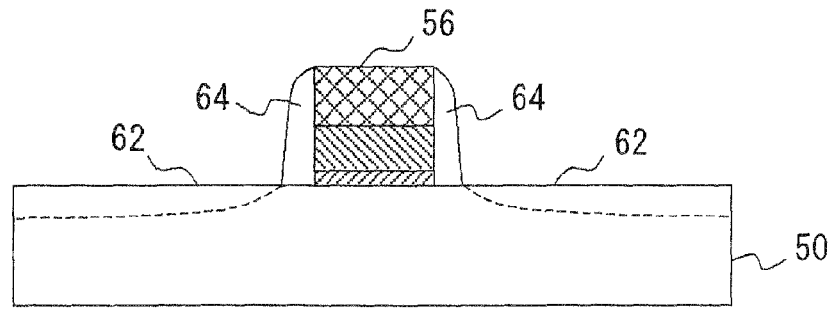

Then, side walls 64 are formed, and thereafter ion implantation processing is carried out to implant ions into the surface of the silicon substrate 50. Thus, impurity regions 62 are formed on the both sides of the underlying portion of the polysilicon layer 56 and gate insulating film 60 by this processing (FIG. 6D). Then, a metallic layer is formed over the entire surface of the silicon substrate 50, and the portions of the metallic layer contacting the polysilicon layer 56 and the impurity region 62 are silicidated, and after that the other portions of the metallic layer are removed to form a metal silicide layer on the gate electrode and source-drain regions (not shown). The polysilicon layer 56 may be replaced with poly SiGe for the gate electrode.

When the ion implantation is conducted to the surface of the silicon substrate 50, moisture remaining on the surface of the silicon substrate 50 may cause a generation of watermarks, leading an uneven processing condition for the ion implantation. In this embodiment, moisture is removed from the surface of the silicon substrate 50 with IPA prior to carrying out the ion implantation, and thus the impurity region 62 can be formed with an even processing condition.

EXAMPLES

Example 1

Similarly as described in the first embodiment with reference to FIGS. 1A to 1D and FIGS. 2A to 2E, the first gate insulating film 26 and the second gate insulating film 28 were formed. In this example, variations in thickness of formed the oxide film in the forming region of the first gate insulating film 26 were measured at respective stages of:
(i) after removing the resist layer 18 with IPA, as shown in FIG. 2A;
(ii) after the cleaning processing for the surface of the silicon substrate 10 with APM and DHF, as shown in FIG. 2B; and
(iii) after RTO processing, as shown in FIG. 2D.
The thickness of the film was measured by using ellipsometer.

In addition, for the purpose of comparison, thickness of the oxide film in the forming region of the first gate insulating film 26 was also measured in the case of replacing IPA with SPM for the removal of the resist layer 18 in the above stage (i), as a comparative example.

Figure 7:
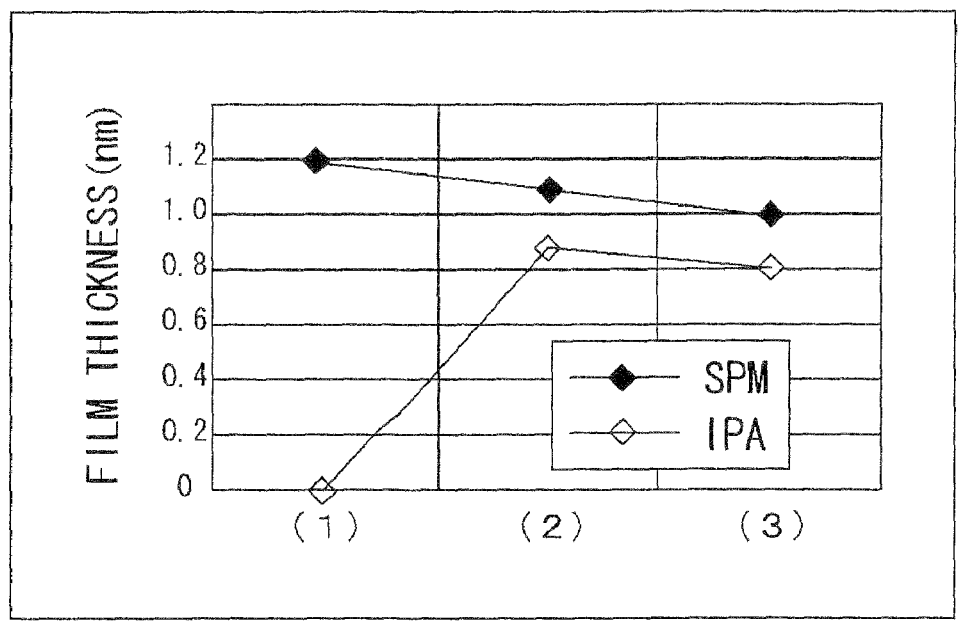
FIG. 7 is a graph of the film thickness of the oxide films of IPA-cleaned and SPM-cleaned, showing the variation of the thickness in the respective process steps.
Figure 8A:
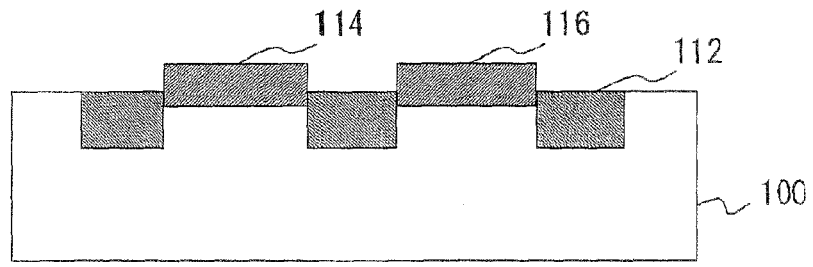
FIGS. 8A to 8D are schematic sectional views of the semiconductor substrate, showing an example of the related art processing steps.
Figure 8B:
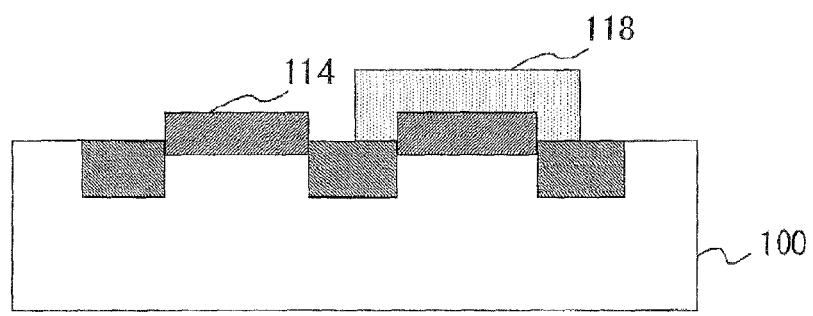
Figure 8C:
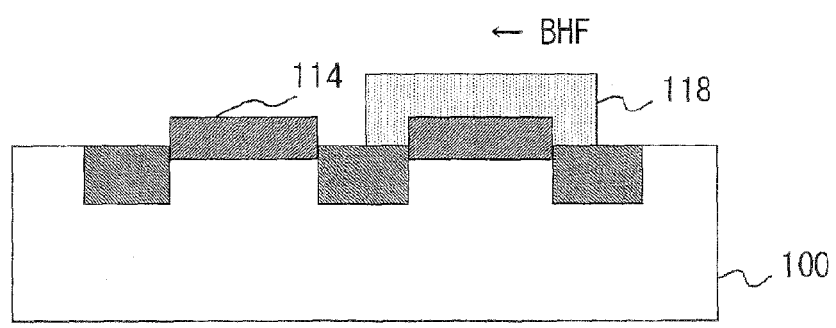
Figure 8D:
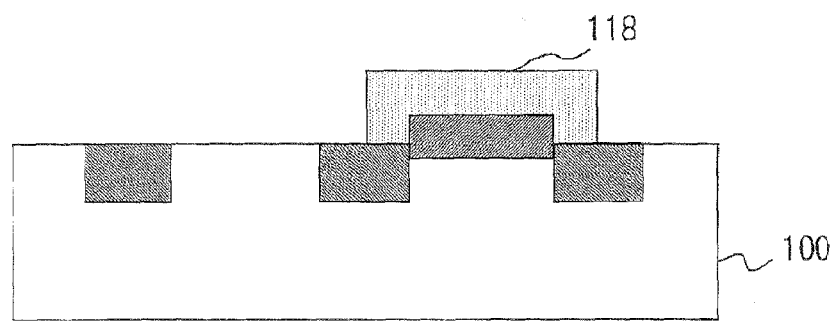

FIG. 7 is a graph showing these measurement results. In the stage (i), i.e., after the removal of the resist layer 18, no oxide layer was formed on the surface of the silicon substrate 10 when IPA was used. On the contrary, in the comparative example, a chemical oxide film having film thickness of 1.2 nm was formed on the surface of the silicon substrate 10 when SPM was used. Thereafter, in the stage (ii), when the cleaning with APM and DHF was conducted, formation an oxide film having a thickness of about 0.9 nm on the surface of the silicon substrate 10 was confirmed, even if the removal of the resist layer 18 in the stage (i) had been conducted with IPA. Subsequently, when RTO processing was conducted in the stage (iii), the generated chemical oxide film shrunk to a certain level. When RTO processing was conducted for the silicon substrate on which the removal of the resist layer 18 was conducted with IPA in the stage (i), the thickness of the chemical oxide film after the stage (iii) was 0.8 nm. On the contrary, when RTO processing was conducted for the comparative silicon substrate on which the removal was conducted with SPM in the stage (i), the thickness of the chemical oxide film after the stage (iii) was 1.0 nm. As such, it was confirmed that the removal processing of the resist layer 18 with IPA was effective in reducing the thickness of the resultant first gate insulating film 26 including the chemical oxide film by about 0.2 nm by comparison with the comparative example including the removal processing of the resist layer 18 with SPM. Further evaluations of the repeated testing were conducted to provide that the controlling the thickness of the resultant first gate insulating film 26 with higher reproducibility.

As mentioned above, it is confirmed that the thickness of the first gate insulating film 26 depends on the thickness of the oxide film formed during the removal of the resist layer 18 and the thickness of the oxide film formed during the cleaning of the silicon substrate 10 with APM and DHF. When the conventional manner of removing the resist layer 18 with SPM is employed, thicker oxide film is formed on the surface of the silicon substrate 10 during the removing processing of the resist layer 18, due to the influence of SPM. On the contrary, when the manner of removing the resist layer 18 with IPA is employed, no oxide film is formed on the surface of the silicon substrate 10 during the removing processing of the resist layer 18. Therefore, the thickness of the eventually obtained first gate insulating film 26 can be reduced by employing IPA for removing the resist layer 18, as compared with the case of employing SPM.

Example 2

A film of $HfO_2$ was formed on a surface of a single crystalline silicon substrate via MOCVD. The resultant product is referred as "sample 1". For the purpose of comparison, the single crystalline silicon substrate is thermally processed to form a thermal oxide film ($SiO_2$) on the surface of the substrate. The resultant product is also referred as "sample 2".

Etchings were conducted for the sample 1 and the sample 2, respectively, with the following chemical solutions at the following temperatures:
(i) phosphoric acid (85%), 160 degree. C.;
(ii) sulfuric acid (96%), 160 degree. C.; and
(iii) hydrofluoric acid (50%), ambient or room temperature.
(where "phosphoric acid (85%)" indicates 85% aqueous solution of phosphoric acid, and this is similarly applicable to other chemical solutions.)

The results of the etch rate for the respective samples and the etch rate ratio are shown in FIG. 10. It was confirmed that, when the conditions of (i) phosphoric acid (85%) at 160 degree. C. and (ii) sulfuric acid (96%) at 160 degree. C. were employed, improved etchings were conducted for the sample 1. It was also confirmed that the etching with the chemical solution containing sulfuric acid provided considerably improve the etch rate ratio, which is determined as (etch rate of $HfO_2$)/(etch rate of $SiO_2$)

Example 3

A film of $HfAlO_x$ was formed on a surface of a single crystalline silicon substrate via MOCVD. The resultant product is referred as "sample 3". For the purpose of comparison, the single crystalline silicon substrate is thermally processed to form a thermal oxide film ($SiO_2$) on the surface of the substrate, similarly as in Example 2. The resultant product is also referred as "sample 4".

Etchings were conducted for the sample 3 and the sample 4, respectively, with the following chemical solutions at the following temperatures:
(i) phosphoric acid (85%), 80 degree. C.;
(ii) sulfuric acid (96%), 160 degree. C.; and
(iii) diluted hydrofluoric acid (DHF) (0.5%), ambient or room temperature.

The results of the etch rate for the respective samples and the etch rate ratio are shown in FIG. 11. It was confirmed that, when the conditions of (i) phosphoric acid (85%) at 80 degree. C. and (ii) sulfuric acid (96%) at 160 degree. C. were employed, improved etchings were conducted for the sample 3. It was also confirmed that these etchings provided considerably improve the etch rate ratio, which is determined as (etch rate of $HfAlO_x$)/(etch rate of $SiO_2$)

According to the present invention, there is provided the technology of controlling the thickness of the silicon oxide film formed on the semiconductor substrate to be thinner is provided. According to the present invention, there is provided the technology for preventing the formation of the unwanted film or the stain such as watermark on the semiconductor substrate. According to the invention, there is provided the technology of controlling the uniformity of the film formed on the semiconductor substrate.

What is claimed is:

1. A method for manufacturing a semiconductor device, comprising a step of wet-processing the surface of a semiconductor substrate with a chemical solution containing an organic solvent as a main component, wherein at least a part of the semiconductor substrate is exposed while the chemical solution is processed thereon; and
further comprising steps of:
forming a first insulating film and a second insulating film in a first region and a second region, respectively, on the semiconductor substrate;
forming a protecting film that covers the second insulating film;
removing the first insulating film to expose the surface of the semiconductor substrate in the first region;
removing the protecting film with a chemical solution containing an organic solvent as a main component;
forming a chemical oxide film in the first region; and
forming a third insulating film on the first region,
wherein the third insulating film has a thickness less than a thickness of the second insulating film.

2. The method of claim 1, wherein the first insulating film, the second insulating film, and the third insulating film are formed by oxidizing the semiconductor substrate in the respective corresponding regions.

3. The method of claim 1, further comprising the step of forming a first high-k insulating film and a second high-k insulating film on the third insulating film and the second insulating film, respectively, the first high-k insulating film and the second high-k insulating film being composed of a material having higher dielectric constant than that of silicon oxide.

4. The method of claim 1, wherein the organic solvent is a solvent having a polar group.

5. The method of claim 1, wherein the organic solvent is selected from the group consisting of:
isopropyl alcohol; ethylene glycol; 2-heptanone; cyclopentanone;
methylethyl ketone; glycol ether; propyleneglycol monomethyl ether; and propyleneglycol monomethyl acetate.

6. The method of claim 1, wherein the organic solvent is isopropyl alcohol.

7. The method of claim 1, wherein the organic solvent is isopropyl alcohol, and the chemical solution contains not less than 90% vol. of isopropyl alcohol.

8. The method of claim 1, wherein the chemical oxide film is formed during cleaning of the substrate.

9. The method of claim 8, wherein the cleaning of the substrate includes particulate contaminant and residual metal removal.

10. The method of claim 9, wherein the particulate contaminant removal includes use of an ammonia-hydrogen peroxide mixture.

11. The method of claim 9, wherein the residual metal removal includes use of a diluted hydrofluoric acid.

12. The method of claim 1, wherein the thickness of the chemical oxide film is less than the thickness of the third insulating film.

13. The method of claim 1, wherein the third insulating film is formed by oxidizing the chemical oxide film.

14. The method of claim 3, further comprising a step of forming a conductive film on each of the first and second high-k insulating films.

15. The method of claim 3, wherein the step of forming a first high-k insulating film and a second high-k insulating film includes steps of:
forming a high-k insulating film along the surface of the semiconductor substrate, the high-k insulating film being composed of a material having higher dielectric constant than that of silicon oxide;
forming a conductive film on the high-k insulating film;
forming a patterned protective film having a predetermined geometry on the conductive film;
selectively removing the conductive film utilizing the protective film as a mask;
selectively removing a portion of the high-k insulating film by selectively removing a part of the high-k insulating film via a dry etching utilizing the protective film as a mask; and
selectively removing the remained part of the high-k insulating film via a wet etching utilizing the conductive film as a mask to partially expose the surface of the semiconductor substrate.

16. The method of claim 15, wherein the selectively removing a part of said high-k insulating film via a dry etching, the dry etching is continued to one-half an entire thickness of the high-k insulating film.

* * * * *